United States Patent [19]

Bernacki et al.

[11] 4,436,584
[45] Mar. 13, 1984

[54] ANISOTROPIC PLASMA ETCHING OF SEMICONDUCTORS

[75] Inventors: Stephen E. Bernacki, Northboro; Bernard B. Kosicki, Acton, both of Mass.

[73] Assignee: Sperry Corporation, New York, N.Y.

[21] Appl. No.: 477,581

[22] Filed: Mar. 21, 1983

[51] Int. Cl.³ .................... H01L 21/306; B44C 1/22; C03C 15/00; C03C 25/06
[52] U.S. Cl. ................................. 156/643; 156/626; 156/646; 156/657; 156/659.1; 156/345; 204/192 E
[58] Field of Search ............... 156/643, 646, 653, 657, 156/659.1, 662, 345, 626; 204/164, 192 E; 430/313, 316, 312; 427/38, 39, 43.1; 148/1.5, 187

[56] References Cited

U.S. PATENT DOCUMENTS

| | | | |
|---|---|---|---|
| 4,333,793 | 6/1982 | Lifshitz et al. | 156/643 |
| 4,341,593 | 7/1982 | Kurisaki et al. | 156/643 |
| 4,372,807 | 2/1983 | Vossen et al. | 156/643 |

Primary Examiner—William A. Powell
Attorney, Agent, or Firm—Howard P. Terry; Arnold L. Albin

[57] ABSTRACT

A method for dry anisotropic etching of semiconductor material by a reactive gas infused in the presence of a low-pressure plasma discharge uses a photoresist mask superposed on a semiconductive film with the slope of the photoresist edges defined within a critical angular range to allow selective formation of a protective polymer film which prevents lateral etching of the edges of the photoresist and sidewalls of the film, while not inhibiting vertical etching, thereby allowing precision definition of the etched pattern. A novel technique to determine the conditions of the photoresist sidewall geometry necessary for polymer film formation and predictable etching behavior encapsulates the film in a thick layer of photoresist, which after cleaving the structure permits selectively etching the photoresist to expose and retain the polymer film without deformation.

10 Claims, 4 Drawing Figures $$V_P = R_R \tan \theta_R = R_P \tan \theta_P \quad (1)$$

$$\frac{\tan \theta_P}{\tan \theta_R} = \frac{R_R}{R_P} \quad (2)$$

ANISOTROPIC PLASMA ETCHING OF SEMICONDUCTORS

BACKGROUND OF THE INVENTION

1. Field of the Invention

The invention relates generally to anisotropic plasma etching and more particularly to a method for precision low-pressure plasma etching of polycrystalline silicon semiconductor devices.

2. Description of the Prior Art

Systems using wet etchants for precision etching of semiconductors in microlithography applications have been previously described. However, the use of wet etchants frequently results in loss of precision in replication of the image due to such factors as undercutting, that is, lateral etching underneath photoresist mask edges, attack by the etchant solution on substrate and photoresist materials, poor control of the profile, loss of adhesion resulting in photoresist lifting, and swelling of the photoresist material. Recently, dry etching techniques have been proposed in which a chemically reactive gas is infused in the presence of a cold plasma or glow discharge to selectively remove areas exposed by the photoresist layer. Dry etching has replaced wet chemical etching in selected semiconductor device fabrication steps because of its capability of accurately replicating photoresist images into underlying films anisotropically, i.e., providing vertical or controllably sloped substantially vertical sidewalls. This capability is believed to be due to a combination of isotropic chemical reactions and anisotropic (directional) physical interactions to the substrate surface. These electric fields accelerate positive ions of a reactive gas which bombard the horizontal substrates normally, thus enhancing the etching rate of horizontally bombarded surfaces with respect to the vertical surfaces which are not ion bombarded.

Dry etching technology is generally described in terms of plasma etching, having chamber pressures of 25-65 Pa (200-500 μm) or greater with wafers loaded on a lower grounded electrode, or by the use of reactive ion etching (RIE) apparatus employing pressures of 0.13-13 Pa (1-100 μm) with wafers loaded on the lower powered electrode. Due to the anisotropic ion bombardment effects, RIE conditions typically yield a lower degree of undercutting or lateral etching underneath the mask. Plasma etching has heretofore continued to present problems with undercutting or lateral etching underneath a mask, attributed to insufficient differentiation in etching rates for horizontal and vertical surfaces. See, for example, S. E. Bernacki, Low Pressure Anisotropic Plasma Etching of Doped Polysilicon in CCl4, Electrochemical Society Inc., May 9-14, 1982 p. 344, which is herein incorporated by reference. However, it has been found possible to obtain anisotropic etching under plasma etching conditions by exploiting chemical reactions occurring in the plasma to form a protective polymer film on the vertical edges of the sidewalls of the mask and polycrystalline silicon (hereinafter also called "polysilicon") films.

SUMMARY OF THE INVENTION

The invention overcomes the disadvantages of the prior art by assuring by means of appropriate sidewall slope control the formation of a protective polymer film on the sidewalls of the overlying process layer and the etched polysilicon film. The protective polymer film is selectively deposited on the exposed sidewalls during the etching process using an active etchant gas such as carbon tetrachloride ($CCl_4$) in a low pressure plasma process. The resulting etch is highly anisotropic and permits etching a thin polysilicon film on a silicon dioxide substrate with no observable undercut, especially at the critical gate-gate oxide interface of a submicron MOS device. The polymer film also forms on photoresist sidewalls of the appropriate profile, thereby precluding sideways erosion and preserving accurate linewidth control even though the photoresist erodes in thickness as with most plasma processes.

The beneficial results of the invention are obtained by patterning by dry chemical anisotropic etching in a plasma discharge of a polycrystalline film of semiconductor material through a mask, the mask having edges whose verticality is defined so that a polymer film is deposited thereon and on the semiconductor material which prevents etching on substantially vertical surfaces that is, surfaces forming sidewalls substantially perpendicular to the substrate surface.

A halocarbon gas is preferably used as the etchant, introduced into a vacuum chamber with a radio-frequency field applied to opposing parallel planar electrodes wherein the material to be etched is disposed.

It is found that the polymer film is formed at mask sidewall-to-vertical angles of 15° or less with high probability of success.

By utilizing the invention, accurate gate linewidth control of semiconductor devices may be obtained with no etch bias and vertical sidewalls. When used with an etchant providing high discrimination between the layer to be etched and the underlying etch stop layer, linewidths of the order of ±500 Å may be repeatably fabricated with high accuracy.

DESCRIPTION OF THE PREFERRED EMBODIMENT

In accordance with the invention, polycrystalline silicon gates etched in a plasma system under particular conditions to be described possess vertical walls coated with a thin polymer film which is resistant to attack under normal etching conditions and therefore prevents undercutting or lateral etching of the mask. The verticality is of paramount importance, for example, in accurately controlling the polysilicon linewidth and therefore the channel length of a MOS transistor. This etching behavior depends on the sidewall slope of the etching mask. Formation of such a film on the mask is a necessary prerequisite for film formation on the polysilicon and successful anisotropic etching.

In order to obtain reliable selective deposition of protective polymer films on etched semiconductor materials, the original mask sidewall must be substantially vertical. Analysis of the polymer film shows that it forms on the mask sidewall as well as that of the underlying substrate. Therefore, once formed, the film prevents sideways erosion of the mask so as to maintain an exact feature size.

On the other hand, under conditions of large initial sidewall slope, it has been found that no film is deposited on the mask sidewall, thereby allowing the mask to etch along its edges as well as in thickness, which continually shrinks the feature sizes. This continual shrinkage of the mask destroys the original dimensions of the mask and leads to sloped polysilicon sidewalls. The use of the etching mask in conjunction with sidewall angles specified within a restrictive range exploits the formation of a polymer film on the mask as well as the etched film in order to assure the desired beneficial precision etching results.

Due to the low pressure and plasma confinement, the anisotropic results are attributed in part to directional positive ion bombardment. The lateral etching is primarily prevented by the deposited polymer film that physically coats the sidewall and protects it from the etching gas. The film appears to be an organic substance which is removed using standard organic cleaning procedures during the normal course of the photoresist stripping process. Because this film has been observed in $CCl_4$ etching of both aluminum and silicon substrates, its formation seems to be a function of the etchant gas rather than the etched substrate. Layered structures of molybdenum silicide and polysilicon have been etched vertically with no discontinuity at the interface, even though the vertical etching rates differ by a factor of two. Another observation supporting the physical etching barrier theory is the absence of accelerated lateral etching upon vertical etch completion as has been described by others in other etching systems. In fact, there has been no sidewall attack with over-etching as much as 200% with proper formulation of the photoresist.

The process of the invention is further illustrated by, but is not intended to be limited to, the following examples.

Figure 1:
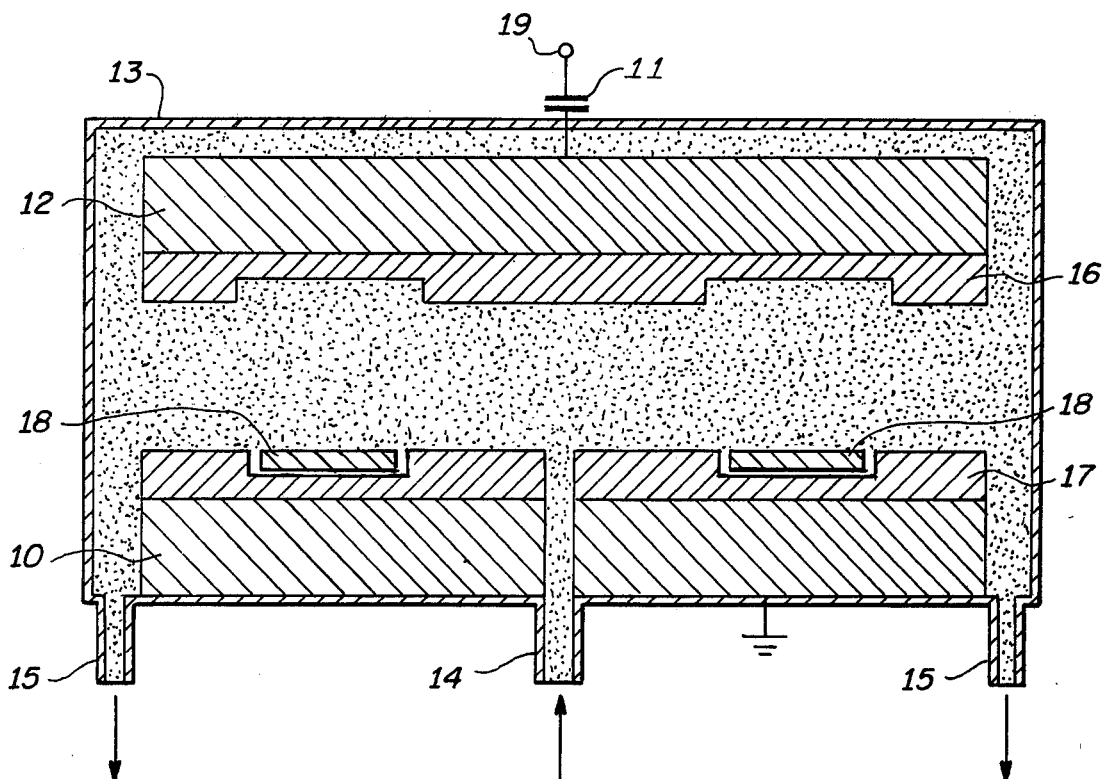
FIG. 1 is a side elevation view of a plasma etching apparatus as used with the present invention.

FIG. 1 shows a preferred apparatus comprising a parallel plate plasma-etching chamber, preferably operated at room temperature with a 13 Pa chamber pressure, 35 sccm $CCl_4$ etchant gas rate, and a radio frequency of 13.56 MHz at a power density of 0.54 W/cm² (total power 1,000 watts). The observed dark space between the plasma and the grounded substrate electrode is approximately 1 mm. Electrodes 10 and 12 have dimensions 35 by 53 cm with an enclosed volume of 2.4 liters. The chamber 13 has a volume of 12.4 liters. The electrodes are rectangular, with a feed 14 for the etchant gas along the center line of the longitudinal axis, and vacuum pumping ports 15 below the lower electrode. Various types of glow discharge apparatus can be employed in the practice of the invention, including reactive ion etchers and other reactor electrode configurations, as are known in the art. The pressure and power used will depend on the equipment employed, with the pressure and power chosen to obtain uniform and consistent polymer depositions.

Additional features of the apparatus as shown in FIG. 1 include a water-cooled quartz lining 16 for electrode 12, and a water cooled stainless steel or anodized aluminum platen 17 for supporting specimen wafers 18. Note that the radio frequency power is applied to upper electrode 19 through capacitor 11, while lower electrode 10 is grounded. The active etchant gas used is $CCl_4$. The pumping system consists of a standard roughing-blower package with an effective pumping capacity at pressures of 13 Pa (100 μm) of 0.15 T-liter/s.

In addition to low chamber pressure, the confinement of the plasma with an electrode separation of 1.3 cm appears to provide a relatively large plasma potential with respect to the grounded substrate electrode 10, although this quantity has not been measured. Most favorable results are obtained when the chamber pressure is reduced as far as possible, which in the vacuum system used was 10–13 Pa (75–100 μm). Note that this pressure is substantially lower than the 25–65 Pa typically used in current plasma etching practice.

The sample used in this embodiment consisted of a 3,000 Å thick polysilicon layer deposited at 615° C. by low pressure chemical vapor deposition onto an oxidized silicon wafer, 3-inch diameter, (100), 20–50 ohm-cm resistivity, doped with p-type impurities. The oxide coating used was silicon dioxide and varied between 250 Å and 750 Å, which variations had no discernable effect on the results. The polysilicon was ion implanted with $3 \times 10^{15}$ arsenic ions/cm² at 50 keV and annealed at 950° C. for thirty minutes in argon gas, resulting in an average bulk resistivity of $1.2 \times 10^{-2}$ ohms-cm. AZ ® 3000 positive photoresist, as manufactured by American Hoechst Corp., Somerville, NJ., of initial thickness 1.2 μm, was used and exposures were performed on conventional ultraviolet contact printing equipment. Intentional sloping of the photoresist sidewall was obtained for selected observations by postbaking the vertical-sidewalled resist patterns at temperatures between 100° C. and 140° C. for various lenghts of time.

Figure 2:
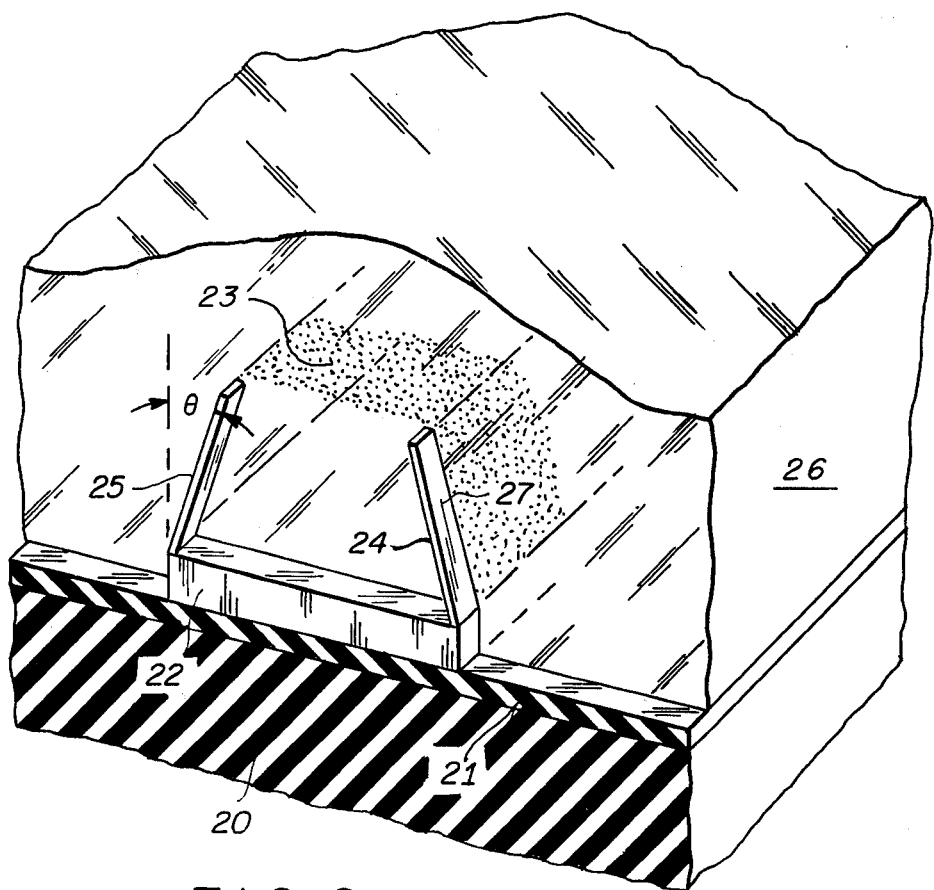
FIG. 2 is a perspective view showing a cross section through a deposited film useful in understanding the present invention.

Referring now to FIG. 2, which shows a perspective view of an oxidized substrate coated with photoresist, a sidewall angle $\theta$ is defined by the angle between the normal to the substrate 20 and the slope of the sidewall 24 or 25. It has been found that when the masking photoresist has sidewalls possessing relatively large $\theta$ angles the polysilicon has sloping sidewalls and the linewidth is reduced, depending on over-etch time. The resulting etch profiles closely fit those predicted by a simple, purely anisotropic etching model, which assumes that all points of an exposed surface are etched at constant rate R in the vertical direction. The etch rate R is a property of the material being etched and may vary between different semiconductor materials, as well as with the chamber exposure conditions. This model is applied in FIG. 3 to a photoresist mask with sidewall angle $\theta$.

Figure 3:
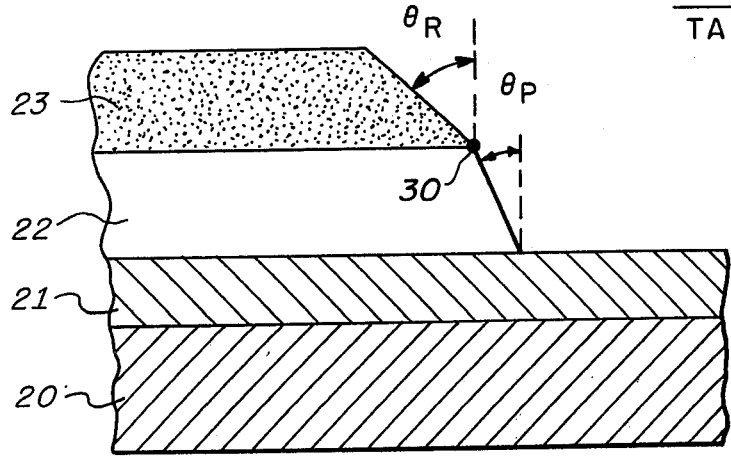
FIG. 3 is a side elevation view of a deposited film in cross section showing the derivation of the critical angle of the present invention.

FIG. 3 shows a partial section of the structure of FIG. 2 enlarged for clarity. The vertical etch rate for the photoresist material 23 is denoted by $R_R$. As a consequence of the sloped edge of the photoresist at angle $\theta_R$ being etched vertically at rate $R_R$, the horizontal edge 30 of the mask 23 will be etched horizontally at a rate $R_R \tan \theta_R$, where $\theta_R$ defines the angle between the slope of the photoresist 23 and the normal to the surface of the substrate. Similarly, the sloping edge of the polysilicon film 22 will be etched vertically at a rate $R_P$ and horizontally at a rate $R_P \tan \theta_P$.

Since the horizontal etch rate of point 30 is $V_P$, and $$V_P = R_R \tan \theta_4 = R_P \tan \theta_P \tag{1}$$

it follows that $$\tan \theta_P / \tan \theta_4 = (R_R / R_P) \tag{2}$$

Thus, as a consequence of the resist being etched vertically with rate $R_R$, the point 30 in FIG. 3 moves laterally to the left at the rate $R_R \tan \theta_R$. The movement of point 30, the effective edge mask, combines with the etch rate $R_P$ of the polysilicon to produce a sidewall angle $\theta_P$ satisfying equation (1). From equation (2), it is seen therefore that the tangent ratio is substantially constant with change in photoresist sidewall angle, for the simple anisotropic etching model.

Figure 4:
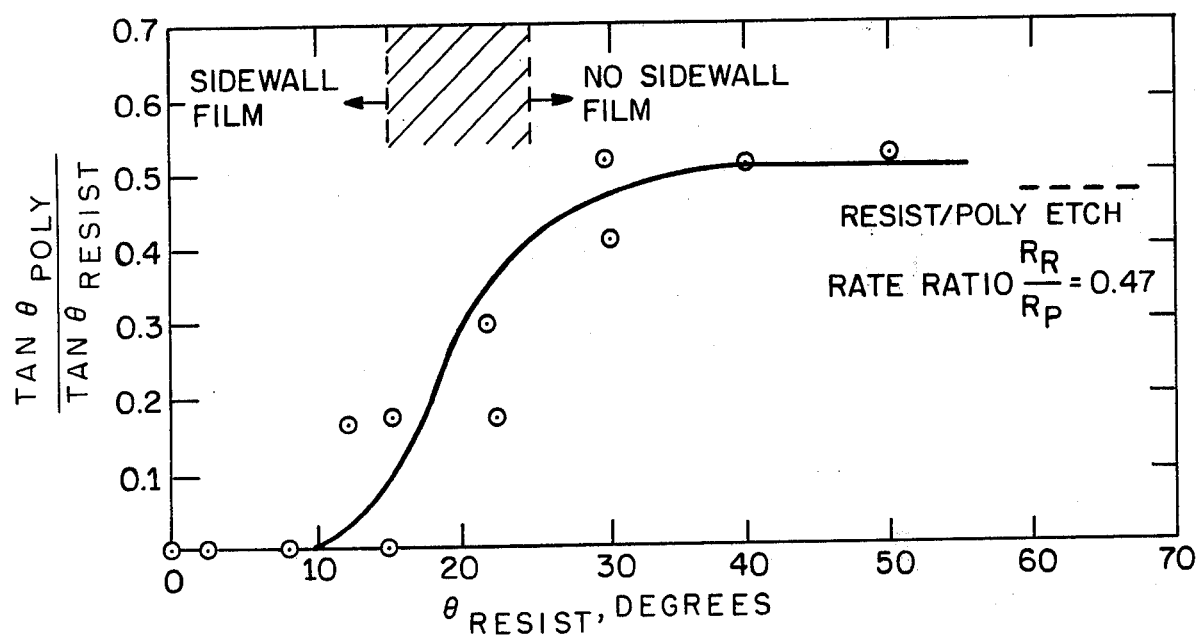
FIG. 4 is a graph showing etchant rates as a function of photoresist sidewall angle.

FIG. 4 shows the unexpected results for resist sidewall angles less than 30°, as compared with the theoretical tangent ratio of equation (2) and $\theta_R$, the original resist angle. As shown in the figure the unpatterned etch rate is $R_R/R_P = 0.47$. It may be seen therefore that for resist angles $\theta_R$ greater than 30°, the tangent ratio is substantially constant and in good agreement with the predetermined constant resist/polysilicon etch rate ratio of 0.47. However, as the resist angle decreases below 30° the polysilicon angle no longer decreases with the photoresist angle in accordance with the equation of the model, but is seen to drop abruptly to zero at about 10° resist angle. This angle denotes the point at which the protective polymer formation is assured and is herein defined as the critical angle $\theta_{crit}$.

FIG. 4 also shows superimposed thereon the results of encapsulation observations made by the novel procedure described below. It is seen that the presence of a sidewall film is indicated for $\theta_{resist}$ angles of 15° or less and is absent for angles of 25° or greater. The shaded region between 15° and 25° signifies that the film was present in some measurements and absent in others, reflecting the apparently high sensitivity of this region to small changes in etching parameters.

To stabilize the photoresist sidewall geometry while investigating the film formation a novel encapsulation technique was developed. Referring again to FIG. 2 a substrate 20 has a superposed oxide 21 and a polycrystalline semiconductor film 22 deposited thereon. An original photoresist mask 23 is deposited upon the semiconductor film 22 defining edges 24 and 25. After etching in the plasma apparatus the entire sample is coated with an additional layer of thick resist 26 referred to as encapsulating resist. The sample is then cleaved in the usual manner exposing a cross sectional face of the entire structure. The specimen is then etched in oxygen plasma which differentially etches and recesses the photoresist faces while leaving the polymer sidewall film substantially unaffected. Note that by this procedure the polymer film is rigidly constrained in its original configuration as opposed to prior art methods which relied on mechanical or chemical methods to dislodge the film for observation, thereby losing the information conveyed by the angle of its original position.

When the encapsulation technique was applied to etching samples with large photoresist sidewall angles, there was observed substantial lateral erosion of the photoresist and the polysilicon film. Conversely, when samples with small or zero sidewall angles were etched, vertical polysilicon sidewalls were observed, with no change in polysilicon linewidth even upon over-etching as much as 300%, and encapsulation clearly revealed the formation of sidewall film.

These results clearly show the beneficial effects of providing a photoresist mask with sidewall angle $\theta$, where $\theta$ is less than a predetermined value $\theta_{crit}$ in conjunction with a suitable etching environment which etches surfaces which have angles greater than $\theta_{crit}$ (including $\theta = 90°$ or horizontal surfaces) while depositing a protective polymer film, which prevents etching on surfaces which have angles less than $\theta_{crit}$.

It will be apparent to those skilled in the art that variations of this embodiment may include other mask materials such as PMMA or polyimide, other semiconductor materials such as molybdenum silicide, tantalum silicide, silicon dioxide, aluminum or monocrystalline silicon, and other etchant gases containing carbon and chlorine such as $CCL_3F$ and $CCL_2F_2$. Moreover, it will be clear that critical angles and etchant ratios will be dependent on the films, photoresist, and etchant gases employed.

While the invention has been described in its preferred embodiments it is to be understood that the words which have been used are words of description rather than limitation and that changes may be made within the purview of the appended claims without departing from the true scope and spirit of the invention in its broader aspects.

We claim:

1. A method of patterning the surface of a material, to be etched within selective regions, said regions defining sidewalls substantially normal to said surface, comprising the following steps:

providing a substrate with a planar surface, depositing an overlying process layer with apertures corresponding with said regions, said layer having substantially vertical edges, etching said material within a plasma environment contained within a discharge apparatus, said plasma resulting for imposition of an electrical field across a gaseous halocarbon compound betwen two electrodes, said plasma determined by an electrical power density and a total pressure, said gaseous compound chemically reacting with said plasma to form a polymer film on said processing layer and said material, said polymer film formed only on said edges and on said sidewalls, thereby lessening the lateral etch rate relative to the vertical etch rate of said surface being etched, so that said etching is substantially ideally anisotropic, said etching step being primarily due to directional positive ion bombardment and chemical reaction with said material to be etched, etching being sufficiently selective to remove a desired thickness below said material surface while retaining a sufficient thickness of said processing layer to prevent substantial attack of the surface below portions of said processing layer which are not apertured.

2. The process as set forth in claim 1, in which said processing layer edges are further defined by a critical angle measured by the angle formed by at least one of said edges and the normal to said substrate, so that said polymer film is deposited on surfaces having angles less than said critical angle.

3. The process as set forth in claim 1, in which said critical angle is about 15° or less.

4. The process as set forth in claim 1, in which said plasma field is created by a discharge between electrodes in a halocarbon atmosphere at a pressure of about 13 Pa and power of about 1,000 watts.

5. A process of patterning a semiconductor wafer by dry chemical anisotropic etching, comprising the steps of:

providing a semiconductor wafer with a plane surface, forming an insulating layer on said surface, depositing a film of polycrystalline silicon on said layer, doping said film with impurities in a concentration sufficient to render said film essentially conductive, coating said film with a layer of masking material;

patternwise exposing said masking material to radiation, processing said masking material so as to preferentially remove portions of said photoresist, thereby forming an etching mask, said mask having relatively vertical edges with respect to said surface, and disposing said wafer within a halocarbon plasma directional positive ion bombardment environment contained within a discharge apparatus under a partial vacuum, whereby a polymer film is deposited only on said relatively vertical edges of said mask and relatively vertical edges of said polycrystalline film which substantially prevents lateral etching while allowing preferential removal of portions of said polycrystalline layer.

6. The process as set forth in claim 5, in which said mask edges are further defined by a critical angle measured by the angle formed by at least one of said edges and the normal to said wafer, so that said polymer film is deposited on surfaces having angles less than said critical angle.

7. The process as set forth in claim 6, in which said critical angle is about 15° or less.

8. The process as set forth in claim 5, in which said plasma field is created by a discharge between electrodes in a halocarbon atmosphere at a pressure of about 13 Pa and power of about 1,000 watts.

9. In the process as set forth in claim 1, a method for determining the presence of a deposited polymer film, comprising:

depositing a doped semiconductor film on an oxidized substrate, applying a first layer of photoresist material on said substrate, etching said semiconductor film through said photoresist layer in a low pressure plasma discharge in a halocarbon atmosphere to form said polymer film, coating said substrate including said semiconductor film, said first photoresist layer, and said polymer film with a second layer of photoresist, thick relative to said first layer, whereby said polymer film is rigidly constrained, cleaving said etched substrate with said semiconductor film, said first and second layers of photoresist, and said polymer film superposed thereon; and etching said first layer of photoresist and said second layer of photoresist in an oxygen plasma, whereby said photoresist layers are differentially etched and recessed with respect to said semiconductor film and said polymer film, thereby exposing said polymer film to observation without deformation from its deposited configuration.

10. The process as set forth in claim 9, in which said first layer of photoresist and said second layer of photoresist are etched at a substantially greater rate than said semiconductor film and said polymer film.

* * * * *

UNITED STATES PATENT AND TRADEMARK OFFICE
CERTIFICATE OF CORRECTION

PATENT NO. : 4,436,584
DATED : March 13, 1984
INVENTOR(S) : Stephen E. Bernacki & Bernard B. Kosicki It is certified that error appears in the above-identified patent and that said Letters Patent is hereby corrected as shown below:

Column 4, lines 23-25 - delete "AZ® 3000 positive photoresist, as manufactured by American Hoechst Corp., Somerville, N.J.", and substitute:

"Positive photoresist, sold under the trademark MICROPOSIT 3000, and manufactured by Shipley Company, Inc. Newton, MA 02162,"

Signed and Sealed this

Twenty-fourth Day of July 1984

[SEAL]

Attest:

GERALD J. MOSSINGHOFF

Attesting Officer

Commissioner of Patents and Trademarks